(12) United States Patent
Chang et al.

(10) Patent No.: US 7,259,619 B2
(45) Date of Patent: Aug. 21, 2007

(54) AMPLIFIER CIRCUIT WITH REDUCED POWER-ON TRANSIENTS AND METHOD THEREOF

(75) Inventors: Chun-Hung Chang, Hsinchu (TW); Fu-Yuan Chen, Alian Township, Kaohsiung County (TW); Shu-Hua Wang, Hsinchu (TW)

(73) Assignee: Analog and Power Electronics Corp., Hsinchu (TW)

( * ) Notice: Subject to any disclaimer, the term of this patent is extended or adjusted under 35 U.S.C. 154(b) by 92 days.

(21) Appl. No.: 11/122,096

(22) Filed: May 5, 2005

(65) Prior Publication Data

US 2005/0253650 A1 Nov. 17, 2005

(30) Foreign Application Priority Data

May 17, 2004 (TW) .................. 93113881 A

(51) Int. Cl.
*H03F 1/14* (2006.01)

(52) U.S. Cl. .................. 330/51; 330/149; 381/94.5

(58) Field of Classification Search .................. 330/51, 330/149; 381/94.5
See application file for complete search history.

(56) References Cited

U.S. PATENT DOCUMENTS

| 5,363,062 | A | * | 11/1994 | Nebuloni et al. | ........... 330/296 |
| 6,040,740 | A | * | 3/2000 | Dondale | .................... 330/149 |
| 6,346,854 | B1 | * | 2/2002 | Heithoff | ...................... 330/149 |
| 6,535,742 | B1 | * | 3/2003 | Jiang et al. | ............. 455/452.2 |
| 6,774,684 | B2 | * | 8/2004 | Wu et al. | .................... 327/134 |
| 7,084,701 | B2 | * | 8/2006 | Mendoza et al. | ............. 330/51 |

* cited by examiner

*Primary Examiner*—Patricia Nguyen
(74) *Attorney, Agent, or Firm*—Rosenberg, Klein & Lee

(57) ABSTRACT

In an amplifier circuit with reduced power-on transients, an amplifier has a gain to generate an output signal from an input signal and a reference signal when it is enabled, and a control circuit generates a control signal, based on the output signal and the reference signal, to be supplied to the amplifier during a power-on event. The amplifier is enabled by the control signal when the reference signal reaches the level of the output signal.

10 Claims, 4 Drawing Sheets

AMPLIFIER CIRCUIT WITH REDUCED POWER-ON TRANSIENTS AND METHOD THEREOF

FIELD OF THE INVENTION

The present invention is related generally to an amplifier circuit for an audio system, and more particularly, to an amplifier circuit with reduced power-on transients and a method thereof.

BACKGROUND OF THE INVENTION

Audio systems utilizing amplifier circuits for amplifying audio source signals in order to drive audio devices have been widely used in various electronic products. In a typical application circuit, as shown in FIG. 1, an audio amplifier chip 100 is used to drive an earphone 104 or a loudspeaker 106 based on an audio source signal 102. The audio source signal 102 is fed into the chip 100 through a coupling capacitor 108 and an input resistor 110, and the chip 100 includes two operational amplifiers 112 and 114, with the inverting and non-inverting inputs 116 and 118 of the operational amplifier 112 connected to the input resistor 110 and a reference signal Vref, respectively, so as to generate an output signal Vo+ at the output 120 of the operational amplifier 112 to drive the earphone 104. The output 120 of the operational amplifier 112 is connected to the other operational amplifier 114 by a resistor 112. To generate the reference signal Vref, a voltage divider composed of two resistors 132 and 134 are connected to a supply voltage $V_{DD}$ by a power input 136, in such a way that the reference signal Vref of $V_{DD}/2$, for example, is generated at a node 138, to connect to the non-inverting inputs 118 and 128 of the operational amplifiers 112 and 114, respectively. A capacitor 140 may be coupled to the power input 136 to stable the supply voltage $V_{DD}$ for the chip 100. A bypass capacitor 142 is coupled to the node 138 to be charged to the voltage $V_{DD}/2$, and the capacitance $C_B$ of the bypass capacitor 142 determines the charge rate of the reference signal Vref up to $V_{DD}/2$. The operational amplifier 112, the input resistor 110, and a feedback resistor 144 connected between the output 120 and the inverting input 116 of the operational amplifier 112 constitute a well-known amplifier, and in which the feedback resistor 144 and the input resistor 110 are both outside of the chip 100 for adjusting the gain of the amplifier. However, the feedback resistor 144 and the input resistor 110 may be integrated in the chip 100 instead. The other amplifier is constituted by the operational amplifier 114, the input resistor 122 and a feedback resistor 114, and has a unit gain, for inverting the output signal Vo+ to generate another output signal Vo−. The output signals Vo+ and Vo− constitute a pair of differential output signals for driving the loudspeaker 106. The chip 100 further comprises a bias control circuit 146 to generate two control signals 152 and 154, based on a sleep or shutdown signal SHUTDOWN originated from the system control unit and a select signal or bridge-tied-load signal SEL/$\overline{BTL}$ originated from the earphone socket, for the control of enabling and disabling the operational amplifiers 112 and 114. When powers on, owing to the slew rate of the operational amplifier 112 different from the rate that the reference signal Vref is charged up to a predetermined level, e.g., $V_{DD}/2$, an instant variation occurs in the signal at the output 120 of the chip 100, resulting in an unfavorable noise, referred to as 'pop', emanated from the earphone 104 or loudspeaker 106.

Accordingly, various arts have been proposed for suppression of such power-on pops. Soft start-up is employed in U.S. Pat. No. 5,796,303 issued to Vinn et al. to prevent the operational amplifier from imparting an output voltage to the loudspeaker, together with pre-charging the output of the amplifier circuit up to a predetermined voltage, in such a manner that the power-on pop is suppressed. The output of the amplifier circuit is biased when powers on by U.S. Pat. No. 6,040,740 issued to Dondale, so as to suppress the power-on pops. Hellums provides two different bias currents in U.S. Pat. No. 6,316,993 for the operational amplifier under the control of a mode control signal, such that pops are reduced during power-on period. On the other hand, in U.S. Pat. Nos. 5,642,074 and 5,703,529 issued to Ghaffaripour et al., and U.S. Pat. No. 5,939,938 issued to Kalb et al., the feedback resistor of the amplifier is first bypassed during power-on period, and then restored once the reference signal of the amplifier is charged up to a predetermined voltage, so as to switch the gain of the amplifier to reduce the pops. The control signal for restoring the feedback resistor is further delayed in U.S. Pat. No. 6,346,854 issued to Heithoff, for a better pops reduction. For more illustrative, the scheme employed in these arts are shown by FIG. 2, in which a switch 200 is inserted between a voltage-dividing resistor 133 and the supply voltage $V_{DD}$, and an amplifier 202 has an inverting input 204 connected with the reference signal Vref, a non-inverting input 206 connected with the predetermined voltage supplied by a voltage divider composed of two resistors 210 and 212, and an output 208 to provide a control signal that is further delayed by a delay circuit 216 to generate a delayed control signal 218 to switch a switch 220 shunt to the feedback resistor 144. By switching the switch 220, the feedback resistor 144 is removed or restored to switch the gain of the amplifier, and therefore the power related pops are reduced.

In the above conventional arts, however, there are still imperfections to be improved. Therefore, it is desired a further de-pop improvement to the amplifier circuit.

SUMMARY OF THE INVENTION

One object of the present invention is to provide an amplifier circuit and a method thereof for de-pops during the power-on events of the amplifier circuit.

In an amplifier circuit according to the present invention, an amplifier will generate an output signal from an input signal and a reference signal when it is enabled, and the output signal and the reference signal are fed back to a control circuit, such that a control signal is determined to enable the amplifier.

Preferably, the control circuit comprises a comparator for comparing the output signal with the reference signal to thereby generate the control signal. The control signal transits from one state to another when the reference signal reaches the level of the output signal.

Preferably, the control circuit further comprises a latch circuit for disabling the comparator after the amplifier is enabled.

BRIEF DESCRIPTION OF DRAWINGS

These and other objects, features and advantages of the present invention will become apparent to those skilled in the art upon consideration of the following description of the preferred embodiments of the present invention taken in conjunction with the accompanying drawings, in which.

DETAILED DESCRIPTION OF THE INVENTION

In an amplifier circuit, the power-on pops are generated from the instant variations of the output signal, resulted from the inconsistent charge or discharge rates between the output signal and the reference signal of the amplifier in the amplifier circuit. For the de-pop during power-on events, according to the present invention, a control signal is generated by comparing the output signal with the reference signal, and the amplifier in the amplifier circuit is enabled by the control signal when the reference signal reaches the level of the output signal, thereby suppressing that the instant variations in the output signal.

Figure 1:
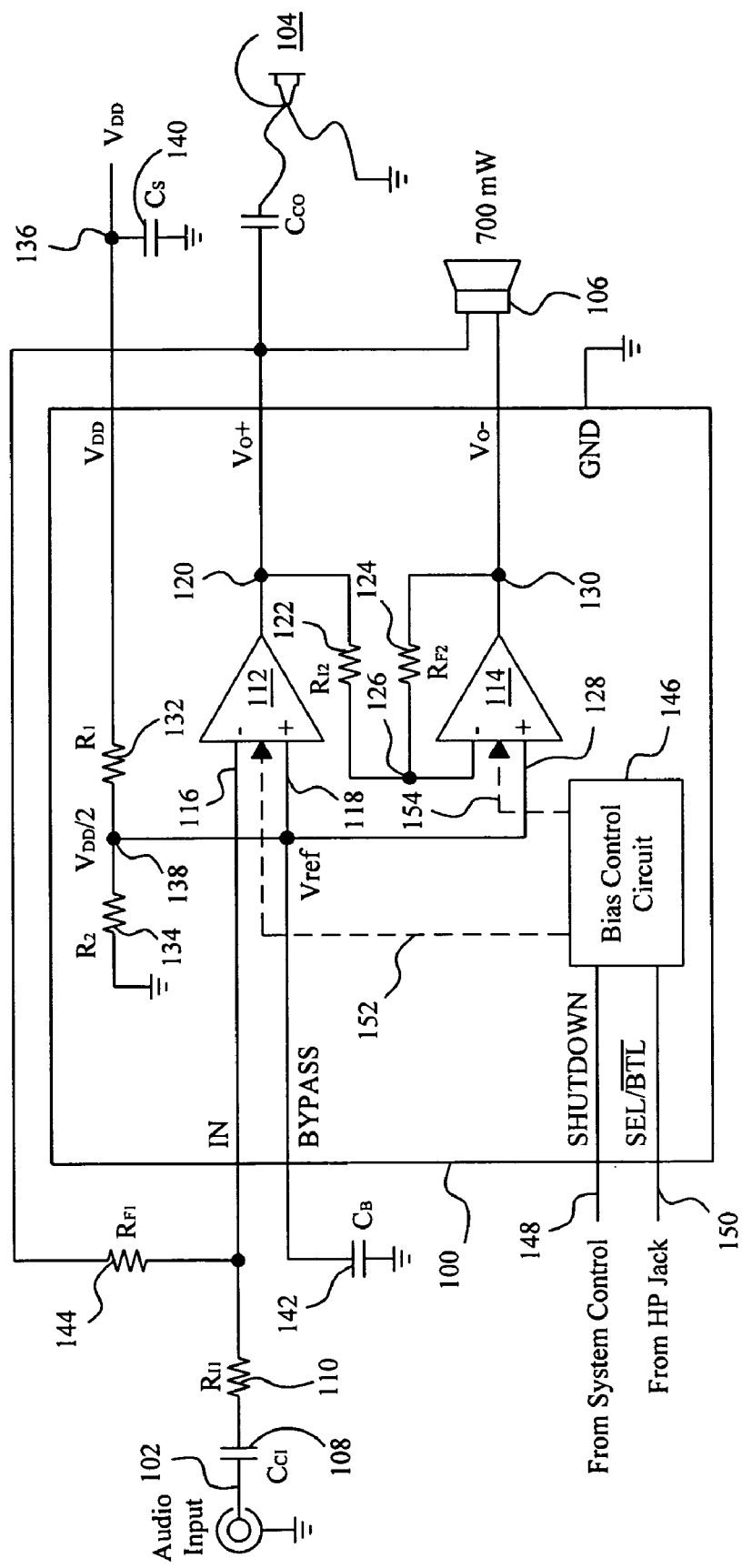
FIG. 1 shows an application circuit of a conventional audio amplifier chip.
Figure 2:
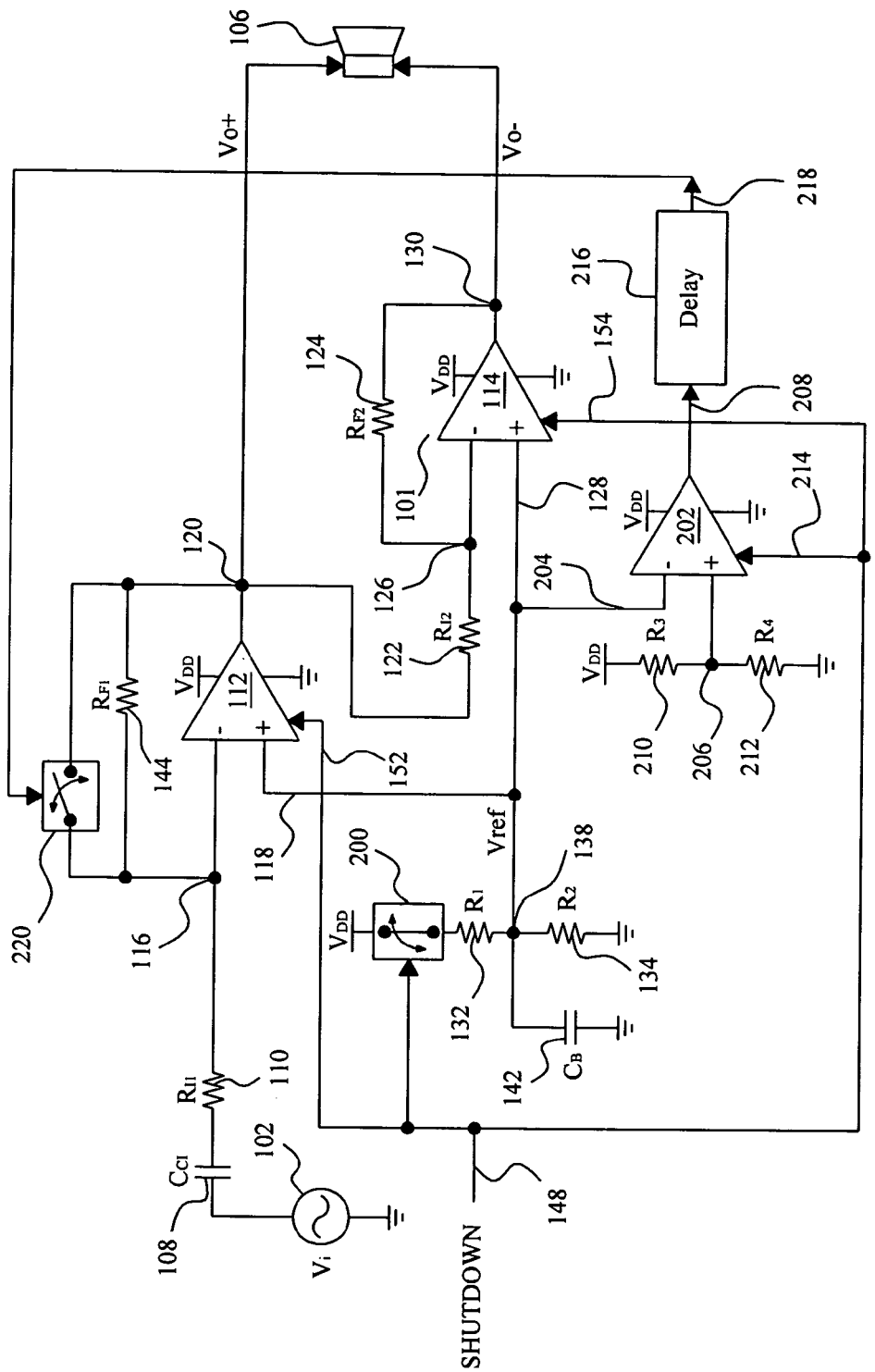
FIG. 2 shows a conventional amplifier circuit with reduced power-on transients.
Figure 3:
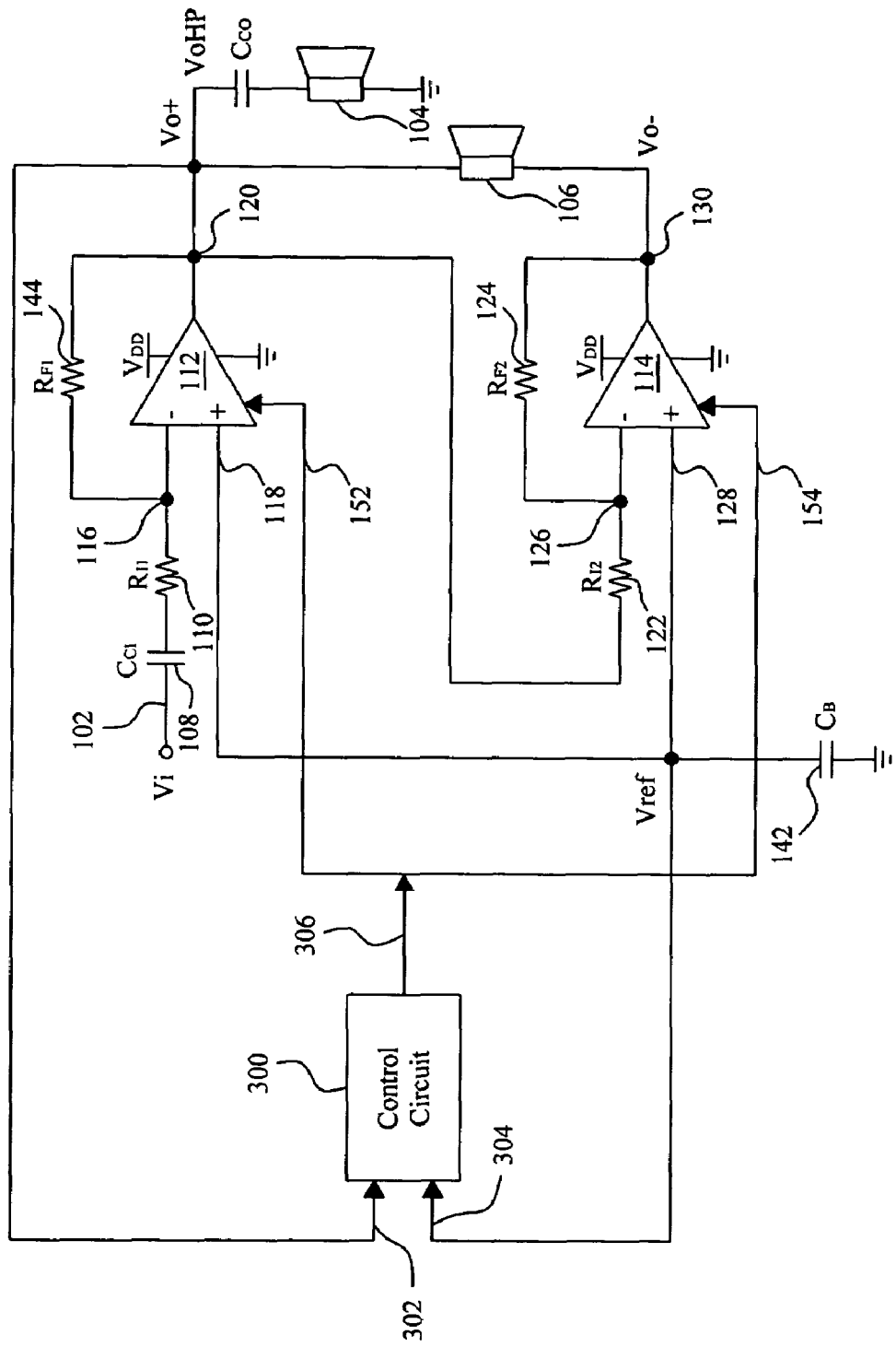
FIG. 3 shows an amplifier circuit according to the present invention.

FIG. 3 shows an amplifier circuit according to the present invention, in which an amplifier comprises an operational amplifier 112, an input resistor 110 and a feedback resistor 144, the input resistor 110 is connected to the inverting input 116 of the operational amplifier 112, an input signal Vi is coupled to the input resistor 110 through a coupling capacitor 108, the non-inverting input 118 of the operational amplifier 112 is connected with a reference signal Vref, the feedback resistor 144 is connected between the inverting input 116 and the output 120 of the operational amplifier 112, and when this amplifier is enabled, it has a gain to generate an output signal Vo+ at the output 120 from the input signal Vi and the reference signal Vref, so as to drive an earphone 104. On the other hand, the output signal Vo+ may be also inputted to another amplifier, and this second amplifier comprises an operational amplifier 114, an input resistor 122 and a feedback resistor 124, in which the input resistor 122 is connected between the inverting input 126 of the operational amplifier 114 and the output 120 of the operational amplifier 112, the feedback resistor 124 is connected between the inverting input 126 and the output 130 of the operational amplifier 114, the non-inverting input 128 of the operational amplifier 114 is also connected with the reference signal Vref. When the second amplifier is enabled, it has a unit gain, with which an output signal Vo− is generated at the output 130 of the operational amplifier 114 by inverting the output signal Vo+ from the first amplifier. Combining this signal Vo− with the signal Vo+, a pair of differential output signals are obtained for driving a loudspeaker 106. For the sake of avoiding the pop generation during power-on period, a control circuit 300 has two inputs 302 and 304 connected with two feedback signals derived from the output signal Vo+ and the reference signal Vref, respectively. Then, a control signal 306 may be generated based on these two feedback signals, so as to be the enable signals 152 and 154 for the operational amplifiers 112 and 114, respectively. During the power-on, when the reference signal Vref reaches the level of the output signal Vo+, the operational amplifiers 112 and 114 are enabled by the control signal 306. Although in the amplifier circuit of FIG. 3 one feedback signal is derived from the output signal Vo+ for the control circuit 300, it should be understood by those skilled in the art that this embodiment may be modified in such a way that this feedback signal is derived from the other output signal Vo− for the control signal 300. The two feedback signals in this embodiment, moreover, may be modified so as to be proportional to the output signal Vo+ and the reference signal Vref, respectively. For instance, by amplifying or attenuating the output signal Vo+ and the reference signal Vref to generate the corresponding feedback signals, the purpose of generating the control signal 306 from the relative levels with respect to the processed signals may be substantially accomplished.

Figure 4:
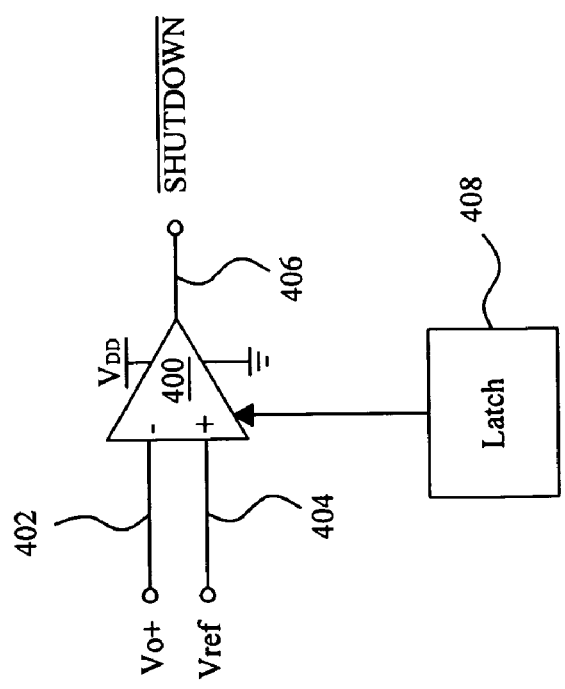
FIG. 4 shows one embodiment of the control circuit in the amplifier circuit of FIG. 3.

FIG. 4 shows one preferred embodiment for the control circuit 300 in FIG. 3, in which a comparator 400 has its inverting and non-inverting inputs 402 and 404 connected with the output signal Vo+ and the reference Vref, respectively, and its output 406 to provide the control signal 306 in FIG. 3. In a power-on event, when the reference signal Vref reaches the level of the output signal Vo+, the control signal 406 transits from one state to another, e.g., from low to high, and accordingly, the operational amplifiers 112 and 114 are changed from disabled state to enabled state, resulting in the normal operation of the amplifier circuit of FIG. 3. The control circuit of FIG. 4 preferably comprises a latch circuit 408 additionally, so as to disable the comparator 400 after the operational amplifiers 112 and 114 are enabled, and to thereby save the power consumption.

Figure 5:
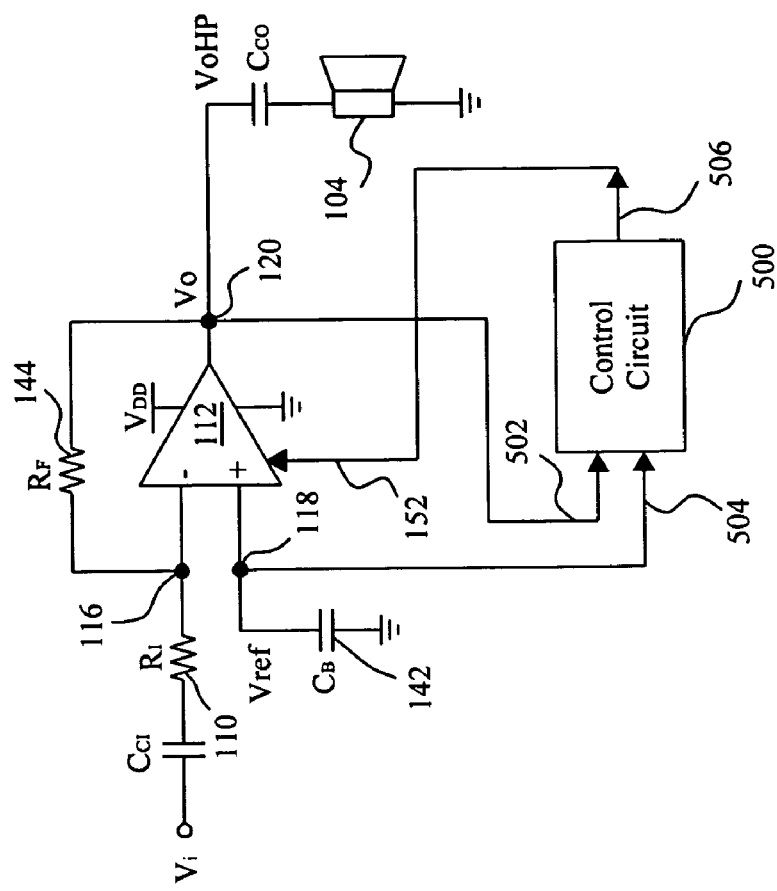
FIG. 5 shows another amplifier circuit according to the present invention.

FIG. 5 shows another amplifier circuit according to the present invention, for driving a single-ended audio device, such as an earphone. In the amplifier circuit of FIG. 5, the operational principles of those elements designated with the same reference numerals as in FIG. 3 are also the same as those illustrated in the first embodiment. However, a control circuit 500 hereof receives the output signal Vo and the reference signal Vref from its inputs 502 and 504, respectively, and outputs a control signal 506 accordingly for the operational amplifier 112 in power-on events. As a result, when the reference signal Vref reaches the level of the output signal Vo, the operational amplifier 112 is enabled by the control signal 506. The circuit of FIG. 4 may be also applied to the control circuit 500 in FIG. 5.

In other embodiments, a threshold may be predetermined in such a way that the operational amplifiers 112 and 114 are enabled once the difference between the output signal Vo+ and the reference signal Vref reaches this threshold.

In the amplifier circuit of the present invention, due to the operational amplifier(s) disabled before the output signal and the reference signal reaching a predetermined difference, the output signal is prevented from the instant variations, and therefore the power-on transients are reduced.

While the present invention has been described in conjunction with preferred embodiments thereof, it is evident that many alternatives, modifications and variations will be apparent to those skilled in the art. Accordingly, it is intended to embrace all such alternatives, modifications and variations that fall within the spirit and scope thereof as set forth in the appended claims.

What is claimed is:

1. An amplifier circuit with reduced power-on transients comprising:

an amplifier, connected with a reference signal, for receiving an input signal and in accordance therewith generating an output signal when it is enabled;

a first feedback signal generated from the output signal;

a second feedback signal generated from the reference signal; and a control circuit, in response to the first and second feedback signals for generating a control signal to enable the amplifier during a power-on event said control circuit having a first input and second input being connected with the first and second feedback signals, respectively, and an output to provide the control signal that transits from one state to another when the second feedback signal reaches the level of the first feedback signal.

2. The amplifier circuit of claim 1, wherein the control circuit comprises a comparator.

3. The amplifier circuit of claim 2, further comprising a latch circuit for disabling the comparator after the amplifier is enabled.

4. The amplifier circuit of claim 2, wherein the first feedback signal is proportional to the output signal, and the second feedback signal is proportional to the reference signal.

5. An amplifier circuit with reduced power-on transients, comprising:
   a first amplifier, connected with a reference signal, for receiving an input signal and in accordance therewith generating a first output signal when it is enabled;
   a second amplifier for generating a second output signal by inverting the first output signal when it is enabled;
   a first feedback signal generated from the first or second output signal;
   a second feedback signal generated from the reference signal; and
   a control circuit, in response to the first and second feedback signals, for generating a control signal to enable the first and second amplifiers during a power-on event.

6. The amplifier circuit of claim 5, wherein the control circuit comprises a comparator having a first input and a second input connected with the first and second feedback signals, respectively, and an output to provide the control signal that transits from one state to another when the second feedback signal reaches the level of the first feedback signal.

7. The amplifier circuit of claim 6, further comprising a latch circuit for disabling the comparator after the first and second amplifiers are enabled.

8. The amplifier circuit of claim 6, wherein the first feedback signal is proportional to the output signal, and the second feedback signal is proportional to the reference signal.

9. A de-pop method for operating an amplifier circuit including an amplifier, connected with a reference signal, to receive an input signal and in accordance therewith to generate an output signal when it is enabled, the method comprising the steps of:
   generating a first feedback signal and a second feedback signal from the output signal and the reference signal, respectively;
   generating a control signal, in response to the first and second feedback signals, for enabling the amplifier during a power-on event; and latching the control signal after the amplifier is enabled.

10. The method of claim 9, wherein the step of generating a control signal comprises comparing the first feedback signal with the second feedback signal.

* * * * *